United States Patent
Wang et al.

[11] Patent Number: 5,908,318
[45] Date of Patent: Jun. 1, 1999

[54] METHOD OF FORMING LOW CAPACITANCE INTERCONNECT STRUCTURES ON SEMICONDUCTOR SUBSTRATES

[75] Inventors: Hsingya Arthur Wang, Saratoga; David Michael Rogers, Sunnyvale, both of Calif.

[73] Assignee: Advanced Micro Devices, Inc., Sunnyvale, Calif.

[21] Appl. No.: 08/932,288

[22] Filed: Sep. 17, 1997

Related U.S. Application Data

[63] Continuation of application No. 08/569,395, Dec. 8, 1995, abandoned.

[51] Int. Cl.$^6$ ................................................. H01L 21/441
[52] U.S. Cl. ...................... 438/619; 438/424; 438/437; 438/439
[58] Field of Search .................................. 438/619, 624, 438/626, 637, 639

[56] References Cited

U.S. PATENT DOCUMENTS

| | | | |
|---|---|---|---|
| 4,987,101 | 1/1991 | Kaanta et al. | 437/228 |
| 5,407,860 | 4/1995 | Stoltz et al. | 437/180 |
| 5,444,015 | 8/1995 | Aitken et al. | 437/182 |
| 5,670,828 | 9/1997 | Cheung et al. | |

Primary Examiner—Caridad Everhart
Attorney, Agent, or Firm—Sawyer & Associates

[57] ABSTRACT

Disclosed herein is a method for forming an interconnect line having low conductor line capacitance between devices formed on an integrated circuit. The method comprises the steps of depositing a removable planarizing layer over fabricated device on the integrated circuit, depositing a first oxide layer over the planarizing layer, etching pillar shafts through the planarizing layer and the first oxide layer for the formation of pillars, depositing a second oxide layer over the first oxide layer filling the pillar shafts to form the pillars, etching contact shafts through the planarizing layer, the first oxide layer, and the second oxide layer to expose contacts for a first device and a second device formed on the integrated circuit, forming an electrical coupling between the contacts of the first device and the second device, etching through the planarizing layer, the first oxide layer, and the second oxide layer to provide accesses to the planarizing layer, removing the planarizing layer to form cavities separated by the pillars and the contact shafts, sealing the accesses to the cavities with a third oxide layer, and introducing an inert ambiance while sealing the accesses to the cavities whereby the dielectric constant of the cavities surrounding the interconnect line is approximately that of the inert ambiance.

26 Claims, 9 Drawing Sheets

METHOD OF FORMING LOW CAPACITANCE INTERCONNECT STRUCTURES ON SEMICONDUCTOR SUBSTRATES

This application is a continuation of application Ser. No. 08/569,395 filed on Dec. 8, 1995 now abandoned.

BACKGROUND OF THE INVENTION

1. Field of the Invention

The present invention relates to fabricating semiconductor devices and more particularly to forming low capacitance interconnect structures for semiconductor devices.

2. Description of Previous Art

As advances in processing technology allow ever increasing numbers of integrated devices to be fabricated on a single integrated circuit (IC), the device geometries of the integrated devices are fabricated at ever decreasing scales. The sizes of the individual integrated devices get progressively smaller. At these reduced device geometries, the ability of the devices to store electrical energy is also reduced. Thus, as the size of the devices get smaller, the capacitance at source and drain junctions and gates of the individual devices is reduced. The total capacitances of individual devices on ICs are also reduced.

At these reduced device capacitance levels, the capacitances of interconnect lines that couple the devices contribute much of the total capacitance associated with each device node. The interconnect capacitance becomes a significant fraction of the capacitance on each circuit node. Particularly, in high speed circuits, interconnect capacitances limit the speeds at which the circuits can function. The problem is even more pronounced in today's reduced device geometry designs. Interconnects on advanced IC's are more dense and more abundant in order to accommodate the increased number of signals in these advanced products. Thus, as the need for smaller, faster, and more complex circuits increases, interconnect capacitance becomes a major problem. The interconnect capacitance problem must be addressed in order to ensure the proper operation of these advanced circuits.

The capacitance of an interconnect line increases with the length of the interconnect line and with the proximity of the interconnect line to other conductors. Stated differently, the interconnect capacitance is proportional to the length of the line and is inversely proportional to the spacing between the line and other conductors. The materials surrounding an interconnect line also affect the capacitances between the line and other proximate conductors. Materials with high dielectric constants increase the interconnect line capacitance, while materials with low dielectric constants decrease the interconnect line capacitance. Stated differently, the dielectric constants of the materials surrounding an interconnect are proportional to the capacitance of the interconnect line. By carefully choosing the type of materials that will surround the interconnect lines of an integrated circuit, the capacitance of the interconnect lines can be manipulated.

Currently, the dielectric constants of materials that are in use for surrounding interconnect lines have relatively high dielectric constants. Some examples of these materials are silicon with a relative dielectric constant of approximately 11.7, silicon nitride with a relative dielectric constant of approximately 7.0, silicon oxide with a relative dielectric constant of approximately 3.9, spin-on glass with a relative dielectric constant of approximately 7.0, and plasma oxynitride or oxide with a relative dielectric constant in the range of approximately 4.0 to 7.0. The exact value of the relative dielectric constant of a region of plasma oxynitride or of a region of plasma oxide depends upon the particular composition of the region. The dielectric constants of these materials and others currently in use are high and cause capacitance problems for integrated circuits fabricated with reduced geometries.

Also, the speed at which these reduced geometry integrated circuits can operate is limited. Advantages in miniaturizing IC's cannot be fully realized when high interconnect capacitance between the devices impose speed limitations on the operation speed of the IC's. As IC fabrication technology develops and produces smaller, faster, and denser IC's, the increased complexity of the interconnects between the integrated devices will further underscore the importance of reducing interconnect capacitance of integrated circuits.

Therefore, it is desirable to provide a method of forming interconnect lines for integrated circuits with low conductor line capacitance between the devices on the integrated circuit. Smaller, faster, and more complex, and more densely packed devices contribute greater advantages to higher performing IC's when interconnect lines have low conductor line capacitance.

SUMMARY OF THE INVENTION

It is an object of this invention to provide interconnect lines with low capacitance for integrated circuits.

It is an additional object of this invention to provide low dielectric constant materials surrounding interconnect lines for integrated circuits.

It is an additional object of this invention to provide increased dielectric isolation between interconnect layers of integrated circuits.

In accordance with the above objects and those that will be mentioned and will become apparent below, the method of forming an interconnect line having low conductor line capacitance between devices formed on an integrated circuit comprises the steps of:

depositing a removable planarizing layer over fabricated devices on the integrated circuit;

depositing a first oxide layer over the planarizing layer;

etching pillar shafts through the planarizing layer and the first oxide layer for the formation of pillars;

depositing a second oxide layer over the first oxide layer filling the pillar shafts to form the pillars;

etching contact shafts through the planarizing layer, the first oxide layer, and the second oxide layer to expose contacts for a first device and a second device formed on the integrated circuit;

forming an electrical coupling between the contacts of the first device and the second device;

etching through the planarizing layer, the first oxide layer, and the second oxide layer to provide accesses to the planarizing layer;

removing the planarizing layer to form cavities separated by the pillars and the contact shafts;

sealing the accesses to the cavities with a third oxide layer; and introducing an inert ambiance while sealing the accesses to the cavities whereby the dielectric constant of the cavities surrounding the interconnect line is approximately that of the inert ambiance.

The method of forming an interconnect line having low conductor line capacitance between devices formed on an integrated circuit is provided. Low dielectric cavities formed between interconnect lines are filled with a low dielectric material to provide dielectric isolation of the interconnect lines. The dielectric isolation of the interconnect lines reduces the interconnect line capacitance. Signal delays which occur due to interconnect line capacitance are reduced, and device operation speeds are not limited by the capacitance of the interconnect lines which couple the devices. Thus, these devices operate at higher speeds. Also, as multiple layers of low capacitance interconnect lines are formed on the integrated circuit, exceptional dielectric isolation is also achieved between the multiple interconnect layers. Thus, devices which are formed between the interconnect layers also benefit from the exceptional isolation of the low dielectric interconnect layers. These devices include capacitors that are used for charge pumping, in precision impedance-capacitor time constant networks, and in precision capacitor voltage dividers.

It is an advantage of this invention to provide interconnect lines for integrated circuits with low capacitance.

It is an additional advantage of this invention to provide low dielectric constant materials surrounding interconnect lines for integrated circuits.

It is an additional advantage of this invention to provide increased dielectric isolation between interconnect layers of integrated circuits.

BRIEF DESCRIPTION OF THE DRAWING

For a further understanding of the objects and advantages of the present invention, reference should be made to the following detailed description, taken in conjunction with the accompanying drawing, in which like parts are given like reference numerals and wherein.

DETAILED DESCRIPTION OF THE INVENTION

A detailed description of preferred embodiments of the present invention is provided with respect to the drawings.

Figure 1:
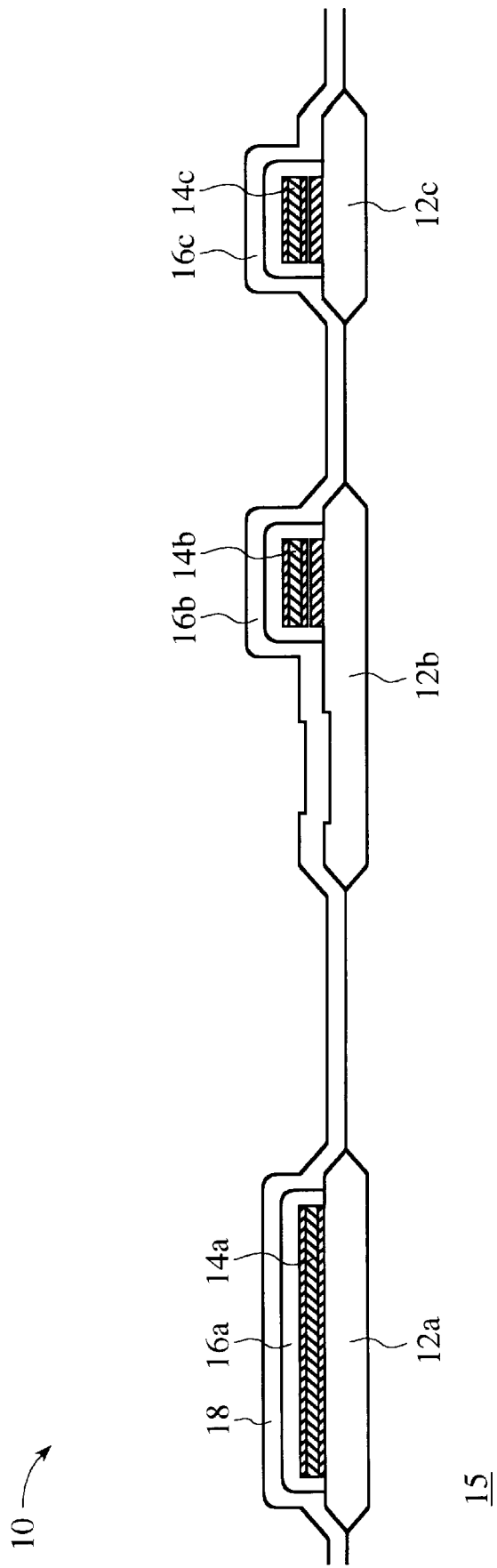
FIG. 1 is a simplified diagram of an interconnect structure for providing interconnects between silicon devices fabricated on a semiconductor substrate according to the present invention.

Like characters refer to like elements throughout. FIG. 1 depicts a first drawing in a series of drawings showing a procedure of fabricating an interconnect line having low conductor line capacitance for a simplified interconnect structure 10 in accordance with the invention. In FIG. 1, the simplified interconnect structure 10 provides interconnections between silicon devices such as complementary metal oxide silicon (CMOS) devices fabricated on a semiconductor substrate 15. The simplified interconnect structure 10 includes field oxide areas 12a, 12b, and 12c, interconnect polysilicon structures 14a, 14b, and 14c, thin thermally grown silicon oxide layers 16a, 16b, and 16c, and a low temperature silicon dioxide layer 18. The field oxide areas 12a, 12b and 12c insulate the interconnect polysilicon structures 14a, 14b, and 14c from the semiconductor substrate 15. The interconnect polysilicon structures 14a, 14b, and 14c provide interconnects between contacts of the CMOS devices fabricated on the semiconductor substrate 15. The interconnect polysilicon structure 14a is a single polysilicon film that connects single gate CMOS devices together. The interconnect polysilicon structures 14b and 14c are double polysilicon films that connect multiple gate CMOS devices together. A multiple gate CMOS device may include a floating gate and a control gate. These multiple gate CMOS devices are often used in flash memory devices. The thin thermally grown silicon oxide layers 16a, 16b, and 16c provide a protective layer over the interconnect polysilicon structures 14a, 14b, and 14c respectively. The low temperature silicon dioxide layer 18 seals-off the interconnect surface and provides a protective layer for the interconnect structure 10.

Figure 2:
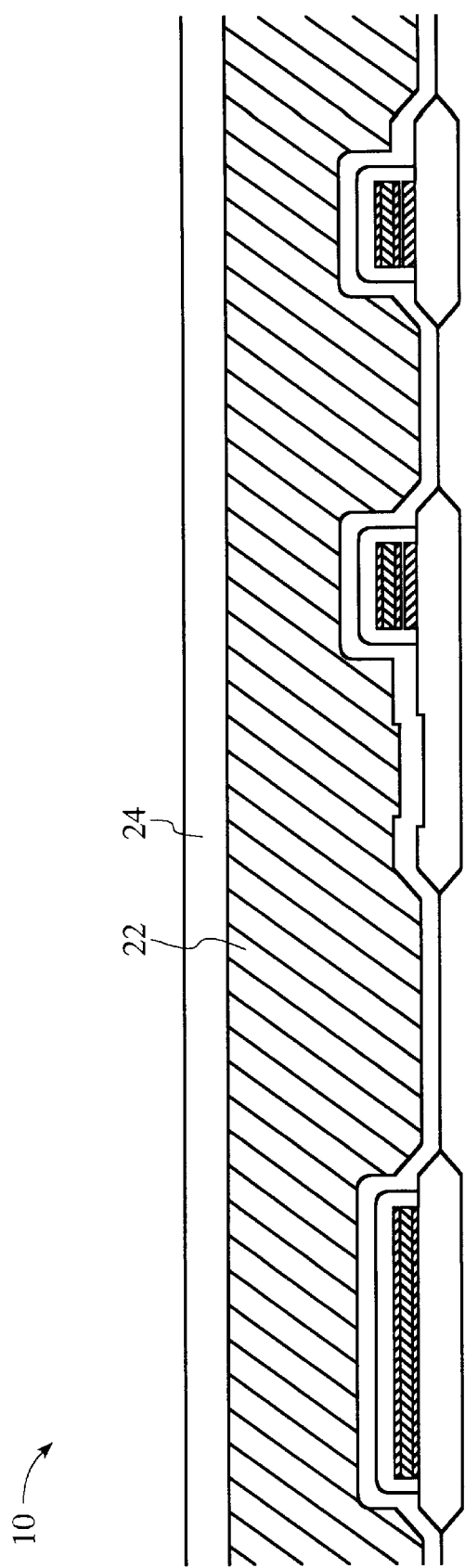
FIG. 2 is a simplified diagram of the interconnect structure having a formation of a removable planarizing layer and an oxide layer formed.

FIG. 2 depicts the simplified interconnect structure 10 with the formation of a removable planarizing material 22 and an oxide layer 24. According to the present embodiment, the removable planarizing material 22 is a spin-on layer of thick photo-resist, polyimide or the like, that can be readily removed in a later procedure. The oxide layer 24 is deposited over the removable planarizing material 22. The oxide layer 24 provides rigidity to the interconnect structure 10 and adds mechanical support to structures that are subsequently formed. The oxide layer 24 may be plasma oxide, ozone oxide or the like.

Figure 3:
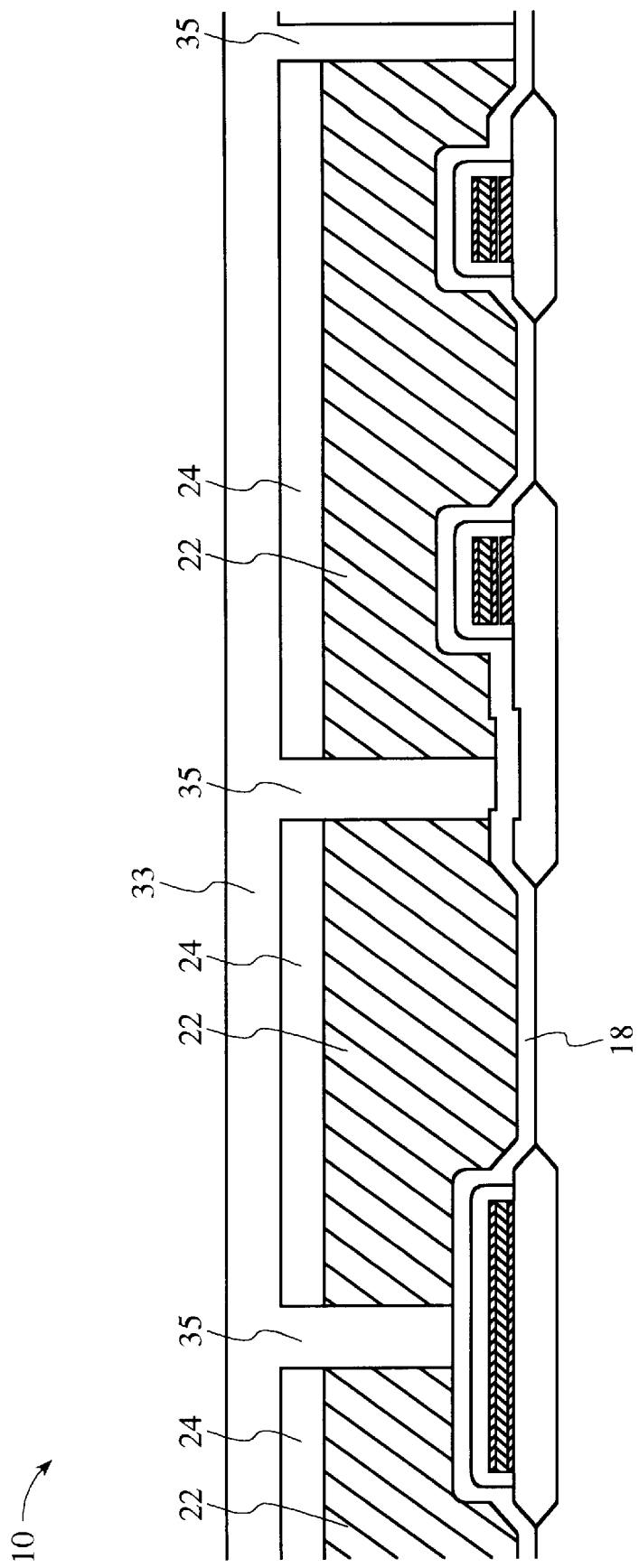
FIG. 3 is a simplified diagram of the interconnect structure having a chemical vapor deposition oxide layer to form pillar and roof structures according to the present invention.

FIG. 3 depicts the simplified interconnect structure 10 with a chemical vapor deposition (CVD) oxide layer 33 forming pillar and roof structures over the interconnect structure 10. The first step in forming pillars 35 is to provide a mask over the oxide layer 24, not shown. The mask defines the location for the pillars 35. Next, pillar channels are etched at the locations defined by the mask for the pillars 35. The pillar channels for the pillars 35 extend through the removable planarizing material 22 and the oxide layer 24 and stop at the low temperature silicon dioxide 18. Once the pillar channels for the pillars 35 are formed, the CVD oxide 33 is deposited over the interconnect structure 10. The CVD oxide 33 fills the pillar channels which extend through the removable planarizing material 22 and the oxide layer 24 to form the pillars 35. As shown in FIG. 3, the CVD oxide 33 is deposited to overfill the pillar channels of the pillars 35 so as to connect the pillars 35 together forming a roof layer.

Figure 4:
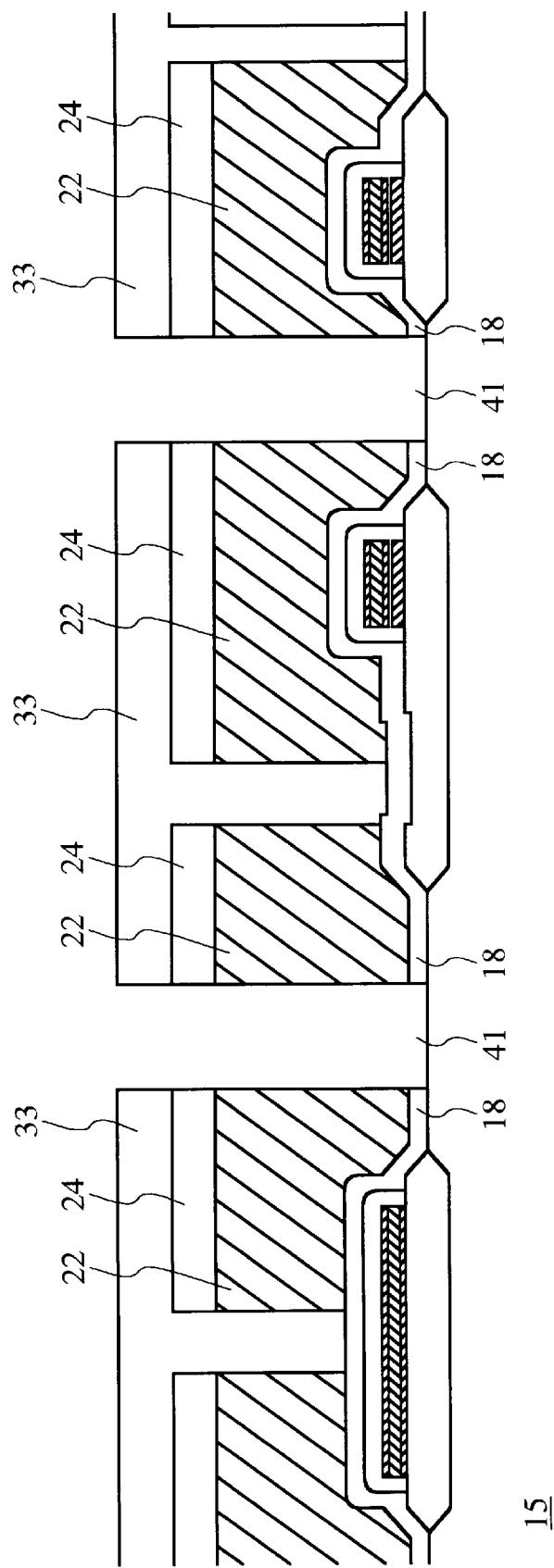
FIG. 4 is a simplified diagram of the interconnect structure with the formation of contact channels in accordance to the present invention.

FIG. 4 depicts the simplified interconnect structure 10 with contact channels 41 formed. The first step in forming the contact channels 41 is to provide a mask over the CVD oxide 33, not shown. The mask defines the location for the contact channel 41. Next, the contact channels are etched at the locations defined by the mask. The contact channels 41 extend through the low temperature silicon dioxide layer 18, the removable planarizing material 22, the oxide layer 24, and the CVD oxide 33 stop at the surface of the semiconductor substrate 15. The contact channels 41 provide accesses to metal contacts for connection to the CMOS devices which are formed on the semiconductor substrate 15.

Figure 5:
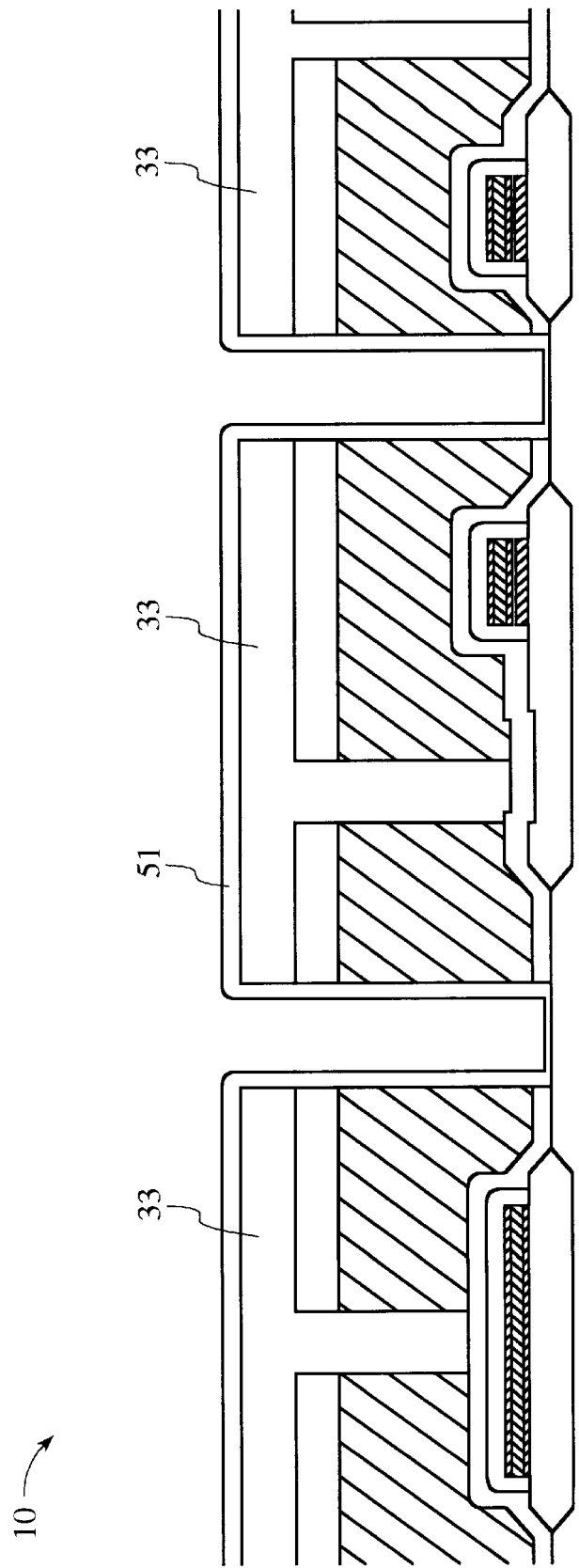
FIG. 5 is a simplified diagram of the interconnect structure with the formation of a deposition oxide layer.

FIG. 5 depicts the simplified interconnect structure 10 with the formation of a deposition oxide layer 51. The deposition oxide layer 51 deposits insulating sleeves for the contact channels 41 which are later formed. The insulating sleeves are formed to protect the removable planarizing material 22 from decomposition during subsequent processing. The deposition oxide layer 51 for the formation of the insulating sleeves may be nitride, oxide, or other similar insulators that provide a similar protective function for the contact channels 41.

Figure 6:
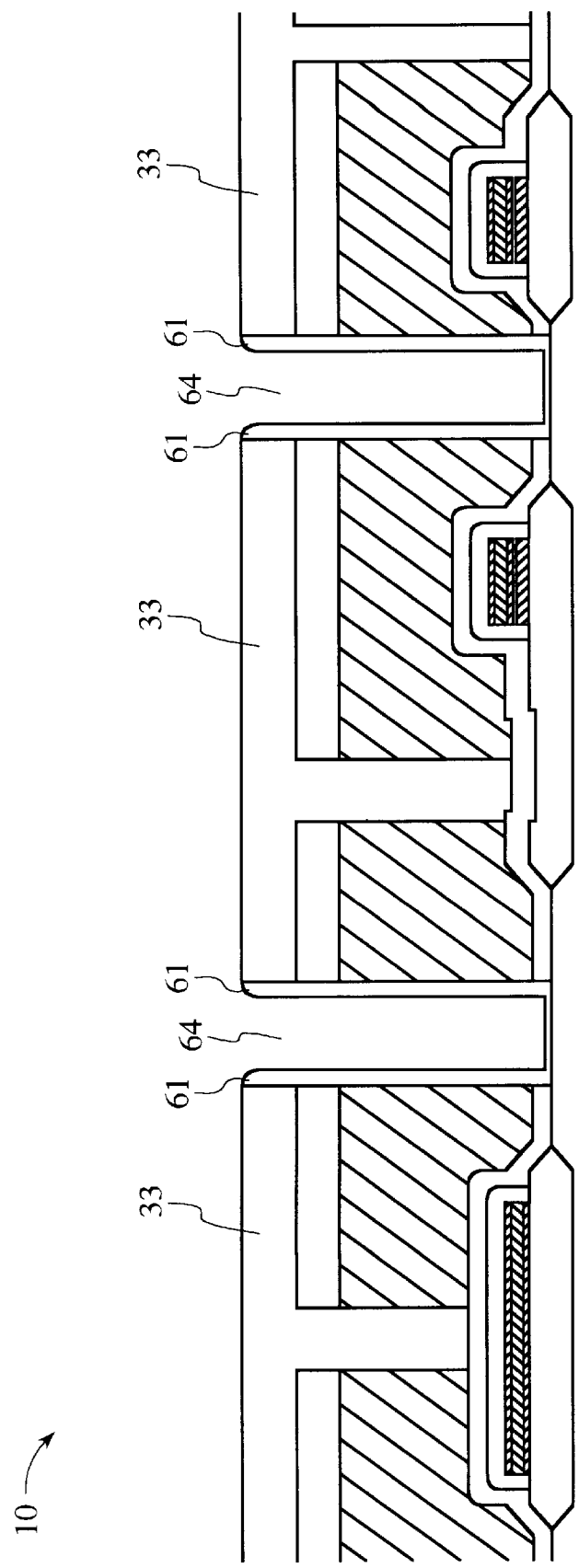
FIG. 6 is a simplified diagram of the interconnect structure with the formation of protective sleeves for the contact channels.

FIG. 6 depicts protective sleeves 61 which are formed by plasma etching of the deposition oxide layer 51. The deposition oxide layer 51 is removed from the CVD oxide layer 33 and the bases of the contact channels 41 to form sleeved contact channels 64.

Figure 7:
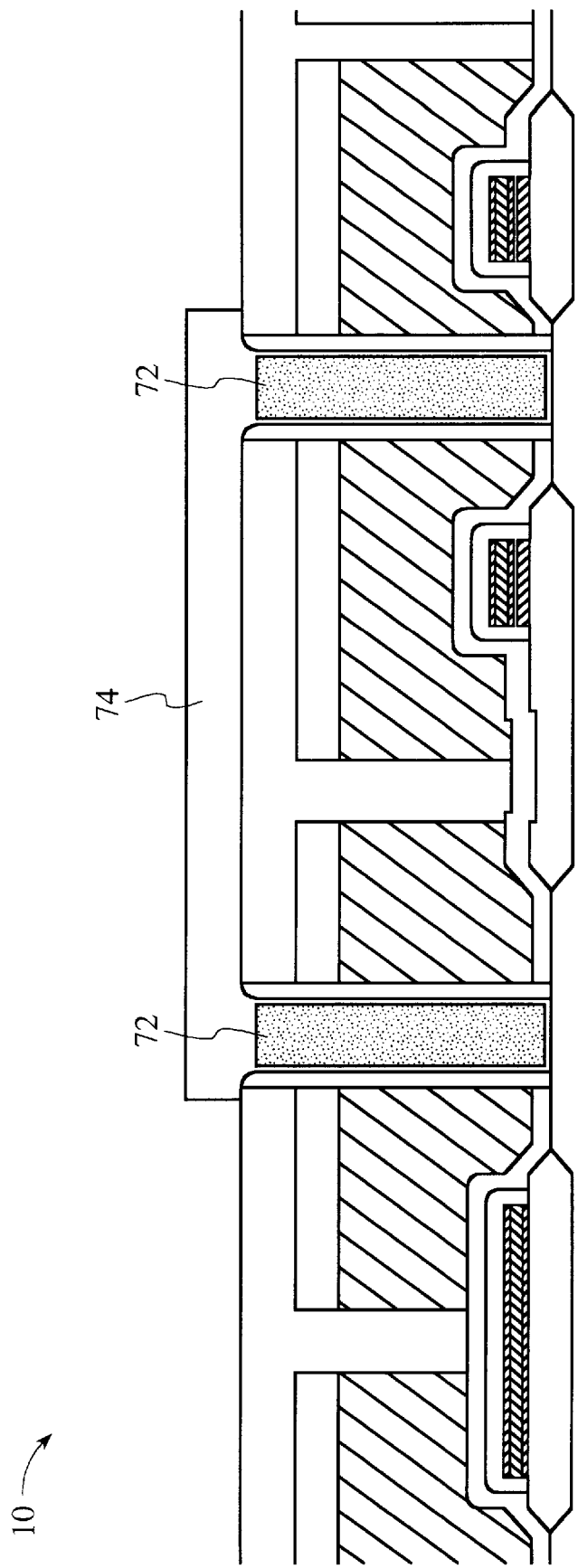
FIG. 7 is a simplified diagram of the interconnect structure with the formation of tungsten plugs and an interconnect layer.

FIG. 7 depicts the simplified interconnect structure 10 with the formation of tungsten plugs 72 and an interconnect layer 74. The contact channels 64 are filled with tungsten plugs 72. The tungsten plugs 72 provide connections to the device contacts on the semiconductor substrate 15. Once the tungsten plugs 72 establish connections to the device contacts, the interconnect layer 74 is deposited over the surface of the CVD oxide layer 33 to establish contact between the tungsten plugs 72. The deposited interconnect layer 74 extends over the entire surface of the interconnect structure 10, not shown. Then, the interconnect layer 74 is masked and then etched to trim the excess deposition of the interconnect layer 74. The completed interconnect layer 74 establishes a connection between the tungsten plugs 72 as shown in FIG. 7.

Figure 8:
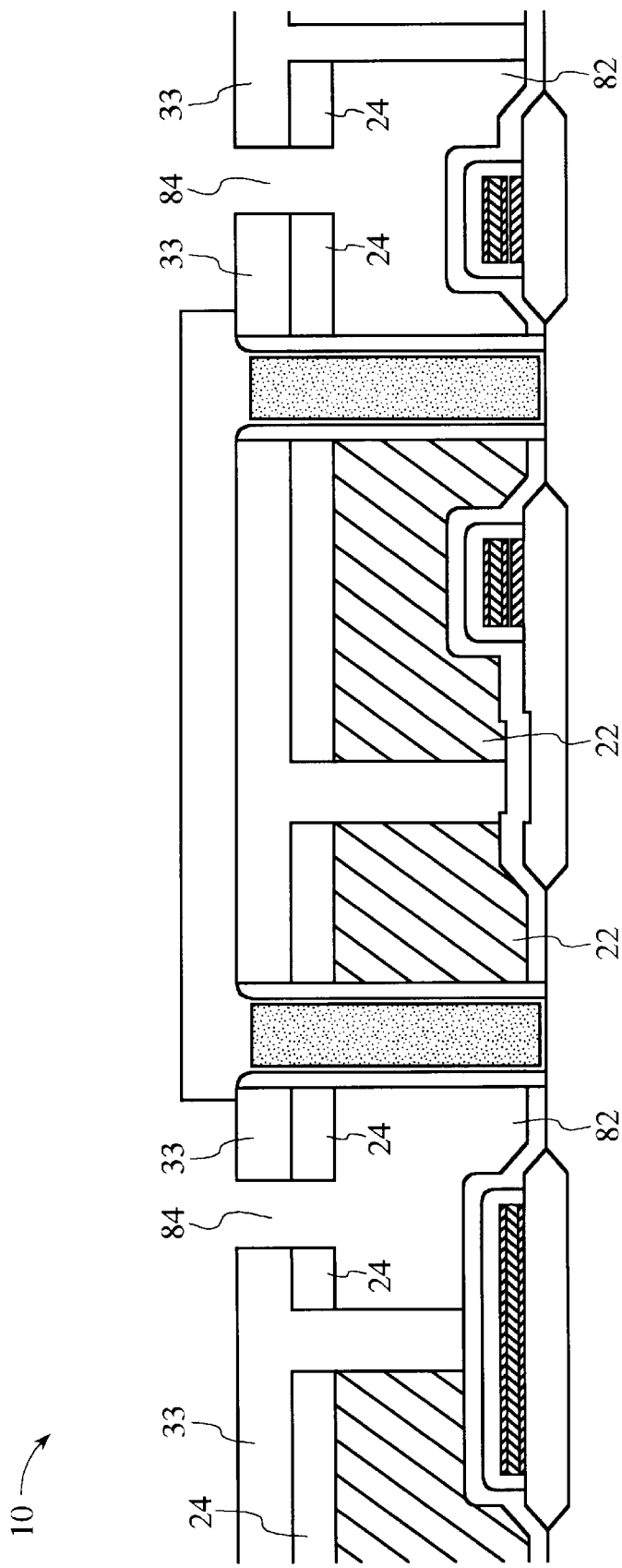
FIG. 8 is a simplified diagram of the interconnect structure with the formation of interconnect cavities.

FIG. 8 depicts the simplified interconnect structure 10 with formation of interconnect cavities 82. The openings 84 provide accesses to the interconnect cavities 82. The openings 84 are defined by a mask placed over the top layer of the interconnect structure 10, not shown. The mask defines areas for the openings 84 on the CVD oxide 33. The defined areas for the openings 84 are etched. The etching process etches through the CVD oxide 33 and the oxide layer 24 to provide accesses to the planarizing material 22. Using the accesses created by the etching process, the planarizing material 22 is dissolved to create the interconnect cavities 82. Solvents such as photo-resist developer, acetone, or the like remove the planarizing material 22. Oxygen plasma ashing can also be used to remove the planarizing material 22 depending on the properties of the planarizing material 22 that was deposited.

Figure 9:
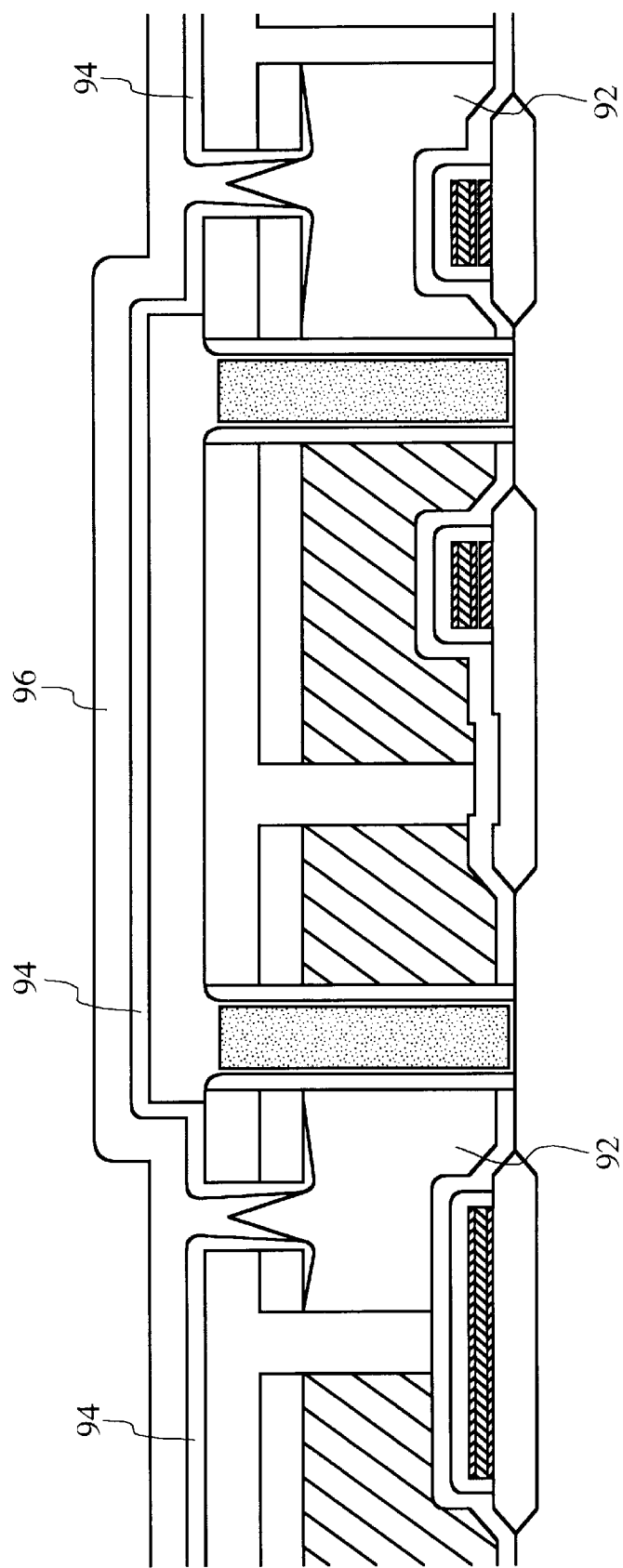
FIG. 9 is a simplified diagram of the interconnect structure with the formation of low capacitance cavities in accordance with the present invention.

FIG. 9 depicts the simplified interconnect structure 10 with formation of low capacitance cavities 92. A CVD oxide layer 94 is deposited for step covering of the interconnect structure 10. The CVD oxide layer 94 conforms with the surface geometry of the interconnect structure 10 and fills irregularities on the top surface of the interconnect structure 10 providing a more ideal surface for the deposition of the oxide layer 96. The oxide layer 96 is sputtered onto the interconnect structure 10 to seal the low capacitance cavities 92. The oxide layer 94 is applied in the presence of an inert gas. Thus, the low capacitance cavities 92 are filled with an inert gas as the oxide layer 96 seals the opening to the low capacitance cavities 92. The inert gas may be argon, helium, or the like. The low capacitance cavities 92 may also be evacuated and sealed in vacuum.

Multiple levels of interconnect structures are fabricated over the interconnect structure 10 to provide additional interconnect lines for the devices formed on the silicon substrate 15. These additional interconnect structures are also formed with low capacitance cavities filled with inert gases or sealed in vacuum.

The relative dielectric constants of inert gases and vacuum are low. Their values are approximately equal to one. Having the cavities filled with inert gases or sealed in vacuum reduces line capacitances of interconnect lines surrounded by the low capacitance cavities. Thus, signal delays due to conductor line capacitance are reduced allowing signals between devices formed on the silicon substrate to operate at higher speeds.

The low dielectric constants of the low capacitance cavities also reduces parasitic capacitance in the parasitic circuits between the devices on the silicon substrate. The reduced parasitic capacitances of the areas surrounding the low capacitance cavities provides many advantages for circuits formed on the semiconductor substrate. These circuits include capacitor circuits for charge pumping, precision impedance-capacitor time constant networks, and precision capacitor voltage dividers. In these three cases, the capacitor plates are formed from the interconnect layers and have relatively little capacitance to other circuit nodes.

Capacitor plates being formed with a high dielectric constant material between them forms capacitors with large capacitances. Yet the exceptionally low dielectric constant material between each of the capacitor plates and adjacent conductors reduces the parasitic capacitance between each plate and those adjacent conductors. This structure forms a capacitor element that has a large capacitance but which has little capacitance between itself and other circuit nodes. Capacitor elements formed in this manner and used as active elements in voltage reference circuits and in precision time constant circuits enable the circuits to be more precise. When used in charge pump circuits, the pump circuits are more efficient. Thus, formation of interconnect structures with low capacitance cavities greatly improves the efficiency and operation speed of circuits that are formed on the silicon substrate.

The foregoing description of the preferred embodiments of the invention has been presented for purposes of illustration and description. It is intended not to be exhaustive or to limit the invention to the precise forms disclosed. Accordingly, a method for fabricating low capacitance interconnect structures is disclosed. The low capacitance interconnect structures allows metal oxide semiconductor (MOS) devices to operate at higher speeds with improved efficiency. The reduction of parasitic circuit elements in circuits between devices formed on the silicon substrate increases the signal propagation speed, capacitor efficiency, and the precision of reference voltage circuits. Obviously, many modifications and variations of the invention will be apparent to practitioners skilled in this art. It is intended that the scope of the invention be defined by the following claims and their equivalents.

What is claimed is:

1. A method of forming an interconnect line having low conductor line capacitance between devices formed on an integrated circuit comprising the steps of:

depositing a removable planarizing layer over fabricated devices on the integrated circuit;

depositing a first oxide layer over the planarizing layer;

etching pillar shafts through the planarizing layer and the first oxide layer for the formation of pillars;

depositing a second oxide layer over the first oxide layer filling the pillar shafts to form the pillars and roof structures supported by the pillars;

etching contact shafts through the planarizing layer, the first oxide layer, and the second oxide layer roof structures to expose contacts for a first device and a second device formed on the integrated circuit;

forming an electrical coupling between the contacts of the first device and the second device;

etching through the planarizing layer, the first oxide layer, and the second oxide layer to provide accesses to the planarizing layer;

removing a portion of the planarizing layer to form cavities separated by the pillars and the contact shafts;

sealing the accesses to the cavities with a third oxide layer; and introducing an inert ambiance while sealing the accesses to the cavities, whereby the dielectric constant of the cavities is approximately that of the inert ambiance.

2. The method of forming the interconnect line according to claim 1, wherein the step of depositing the removable planarizing layer includes the step of applying a spin-on layer.

3. The method of forming an interconnect line according to claim 2, wherein the spin-on layer includes photo-resist.

4. The method of forming the interconnect line according to claim 1, wherein the first oxide layer includes plasma oxide.

5. The method of forming the interconnect line according to claim 1, wherein the second oxide layer is deposited by chemical vapor deposition.

6. The method of forming the interconnect line according to claim 1, wherein the step of etching pillar shafts includes the step of masking the first oxide layer for placement of the pillar shafts.

7. The method of forming the interconnect line according to claim 1, wherein the step of depositing a second oxide layer includes forming a roof layer that couples the pillars together.

8. The method of forming the interconnect line according to claim 1, wherein the step of etching contact shafts includes the step of masking the second oxide layer.

9. The method of forming the interconnect line according to claim 1, wherein the step of forming an electrical coupling includes depositing a protective sleeve for the contact shafts.

10. The method of forming the interconnect line according to claim 1, wherein the step of forming an electrical coupling includes filling the contact shafts with tungsten plugs.

11. The method of forming the interconnect line according to claim 10, wherein the step of forming an electrical coupling includes forming a metal layer to couple the tungsten plugs of the first device with the second device formed on the integrated circuit.

12. The method of forming the interconnect line according to claim 1, wherein the step of removing the planarizing layer includes the step of dissolving the planarizing layer with solvents.

13. The method of forming the interconnect line according to claim 12, wherein the solvents includes photo-resist developer.

14. The method of forming the interconnect line according to claim. 1, wherein the third oxide layer is deposited by chemical vapor deposition.

15. A method of forming low dielectric constant cavities on an integrated circuit to isolate interference from capacitance of functioning devices on the integrated circuit comprising the steps of:

depositing a removable planarizing layer over fabricated devices on the integrated circuit;

depositing a first oxide layer over the planarizing layer;

forming oxide pillars through the planarizing layer;

depositing a second oxide layer coupling the oxide pillars to form an oxide roof supported by the pillars;

etching through the planarizing layer and the oxide roof to provide accesses to the planarizing layer;

removing a portion of the planarizing layer to form cavities separated by the oxide pillars;

sealing the accesses to the cavities with a third oxide layer; and introducing an inert ambiance while sealing the accesses to the cavities whereby the dielectric constant of the cavities is approximately that of the inert ambiance.

16. The method of forming low dielectric constant cavities according to claim 15, wherein the step of forming oxide pillars includes etching pillar shafts through the planarizing layer and the first oxide layer.

17. The method of forming low dielectric constant cavities according to claim 16, wherein the step of depositing a second oxide layer includes depositing the second oxide layer to fill the pillar shafts forming the oxide pillars and the oxide roof.

18. The method of forming low dialectric constant cavities according to claim 15, wherein the second oxide layer is deposited by chemical vapor deposition.

19. The method of forming low dielectric constant cavities according to claim 15, wherein the step of etching includes masking the accesses to the planarizing layer on the oxide roof.

20. The method of forming low dielectric constant cavities according to claim 15, wherein the step of removing includes dissolving the planarizing layer.

21. The method of forming low dielectric constant cavities according to claim 15, wherein the inert ambiance includes argon gases.

22. The method of forming low dielectric constant cavities according to claim 15, wherein the formed cavities comprise a first low dielectric constant cavities layer and a second low dielectric constant cavities layer.

23. The method of forming low dielectric constant cavities according to claim 22 further comprising the step of forming capacitor elements between the first low dielectric constant cavities layer and the second low dielectric constant cavities layer.

24. The method of forming low dielectric constant cavities according to claim 23 wherein the capacitor elements are coupled to provide charge pump circuits.

25. The method of forming low dielectric constant cavities according to claim 23 wherein the capacitor elements provide voltage reference circuits.

26. The method of forming low dielectric constant cavities according to claim 23 wherein the capacitor elements provide impedance-capacitor time constant networks.

* * * * *